United States Patent
Wang et al.

(10) Patent No.: US 7,884,643 B2
(45) Date of Patent: Feb. 8, 2011

(54) LOW LEAKAGE VOLTAGE LEVEL SHIFTING CIRCUIT

(75) Inventors: Guang-Cheng Wang, Zhubei (TW); Ker-Min Chen, Hsinchu (TW); Kuo-Ji Chen, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/494,082

(22) Filed: Jun. 29, 2009

(65) Prior Publication Data
US 2010/0026366 A1 Feb. 4, 2010

Related U.S. Application Data

(60) Provisional application No. 61/079,575, filed on Jul. 10, 2008.

(51) Int. Cl.
*H03K 19/094* (2006.01)
(52) U.S. Cl. .......................................... 326/68; 326/81
(58) Field of Classification Search ............. 326/62–68, 326/80–87
See application file for complete search history.

(56) References Cited

U.S. PATENT DOCUMENTS

| | | | |
|---|---|---|---|
| 6,556,061 B1 | 4/2003 | Chen et al. | 327/333 |
| 6,864,718 B2 * | 3/2005 | Yu | 326/68 |
| 7,053,656 B2 * | 5/2006 | Seo | 326/68 |

* cited by examiner

*Primary Examiner*—Don P Le
(74) *Attorney, Agent, or Firm*—K&L Gates LLP

(57) ABSTRACT

A voltage level shifting circuit for an integrated circuit system having an internal low voltage power supply (VCCL) and an external high voltage power supply (VCCH) is disclosed, the voltage level shifting circuit comprises a pair of cross coupled PMOS transistors connected to the VCCH, a NMOS transistor with a source connected to a ground (VSS) and a gate connected to a first signal swinging between the VCCL and the VSS, and a switching device coupled between a drain of one of the pair of PMOS transistors and a drain of the NMOS transistor, wherein the pair of PMOS transistors are high voltage transistors and the switching device is off when the VCCL is below a predetermined voltage level, and the switching device is on when the VCCL is above the predetermined voltage level.

18 Claims, 4 Drawing Sheets

LOW LEAKAGE VOLTAGE LEVEL SHIFTING CIRCUIT

CROSS REFERENCE

This application claims the benefits of U.S. Provisional Patent Application Ser. No. 61/079,575 which was filed on Jul. 10, 2008, and entitled "LOW LEAKAGE VOLTAGE LEVEL SHIFTING CIRCUIT."

BACKGROUND

The present invention relates generally to integrated circuit (IC) design, and more particularly to voltage level shifter designs.

In a deep submicron technology for a typical IC chip, device feature sizes, such as gate oxide thickness and channel length, have greatly reduced. In order to work with such small geography devices, the power supply voltage have to be lowered, otherwise the gate oxide may breakdown and the transistor channel may punch through. For instance, for a 90 nm technology, the power supply voltage is about 1.0V. However, in a system level, i.e., outside the IC chip, a power supply voltage may still be 2.5V or 3.3V. In order to allow such deep submicron IC chip to properly work in the high voltage system, voltage level shifters have to be employed to shift an external high voltage signal to a corresponding internal low voltage signal, and to shift an internal low voltage signal to a corresponding external high voltage signal.

FIG. 1 is a schematic diagram illustrating a conventional low-to-high voltage level shifter 100. The voltage level shifter 100 comprises a pair of PMOS transistors 112 and 116, a pair of NMOS transistors 122 and 126, and an inverter 130. These devices are connected as a cross-latch. Specifically, the PMOS transistor 112 and the NMOS transistor 122 are serially connected between an external power supply VCCH and a ground VSS, so are the PMOS transistor 116 and NMOS transistor 126. A gate of the PMOS transistor 112 is connected to the common drain of the PMOS transistor 116 and the NMOS transistor 126. A gate of the PMOS transistor 116 is connected to the common drain of the PMOS transistor 112 and the NMOS transistor 122. An input node IN is connected to a gate of the NMOS transistor 122, and to a gate of the NMOS transistor 126 through the inverter 130. An output node OUT is connected to the common drain of the PMOS transistor 116 and the NMOS transistor 126. A skilled in the art would immediately recognize that the voltage level shifter 100 functions as a two serially connected inverters from the input IN and output OUT point of view. For instance, when the input node IN is at a logic HIGH, the NMOS transistor 122 and the PMOS transistor 116 will be turned on, and the NMOS transistor 126 and the PMOS transistor 112 will be turned off, thus the output node OUT will be at the logic HIGH. However, the input node IN operates at an internal voltage between the VSS and a VCCL which is lower than the VCCH, while the output node OUT operates at an external voltage between the VSS and the VCCH. PMOS transistors 112 and 116 and NMOS transistors 122 and 126, exposing to the VCCH, are high voltage transistors with thick gate oxide, etc. The inverter 130, exposing only to the VCCL, is made of low voltage transistors with thin gate oxide, etc. With a proper adjustment of the threshold voltages of the NMOS transistors 122 and 126, the voltage level shifter 100 can achieve a voltage transition point around VCCL/2. In a static state with the node IN either at the logic HIGH or LOW, either the PMOS transistor 112 or the NMOS transistor 122 is off, and similarly, either the PMOS transistor 116 or the NMOS transistor 126 is off, there is no static conduction current flowing through the voltage level shifter 100. However, during a ramping up of the internal voltage, i.e., the voltage at the node IN is between the VSS and the normal VCCL, the NMOS transistor 122 may be weakly turned on, while the PMOS transistor 112 is still not turned off. There will be active current flowing through the PMOS transistor 112 and the NMOS transistor 122. Similarly, during a ramping down of the internal voltage, there are active current flowing through the PMOS transistor 116 and the NMOS transistor 126.

Besides, some modern memory chips employ a power saving mode. That is when the internal circuit is in a non-functional state, the internal voltage VCCL is lowered to a level just enough to maintain data in the memory. By lowering the power supply voltage, the chip's power consumption can be drastically reduced. Even though the core circuit saves power in the power saving mode, conventional voltage level shifters may introduce stray current. Referring again to FIG. 1, the output node OUT of the voltage level shifter 100 is coupled to the VSS through a high voltage NMOS transistor 142. A gate of the NMOS transistor 142 is controlled by a signal POCH which is generated by the voltage detection circuit (not shown). When the VCCL is lower than a predetermined voltage, POCH is in the logic HIGH, so that the NMOS transistor 142 is turned on and clamps the node OUT to the VSS. In so doing, the output voltage maintains certain even the internal circuit is not operating.

Referring again to FIG. 1, when the node OUT is at the VSS, the PMOS transistor 112 is on. Since the internal circuit is not operating, the node IN may be floating, and very well turn on the NMOS transistor 122. Therefore, during the power saving mode, unintentional active current may flow through the PMOS transistor 112 and the NMOS transistor 122 and defeat the power saving purpose.

As such, what is desired is a voltage level shifter that has minimized power consumption.

SUMMARY

The present invention discloses a voltage level shifting circuit for an integrated circuit system having an internal low voltage power supply (VCCL) and an external high voltage power supply (VCCH), the voltage level shifting circuit comprises a first and a second PMOS transistor each with a source connected to the VCCH, a gate of the first PMOS transistor being connected to a drain of the second PMOS transistor, and a gate of the second PMOS transistor being connected to a drain of the first PMOS transistor, a first NMOS transistor with a source connected to a ground (VSS) and a gate connected to a first signal swinging between the VCCL and the VSS, and a first switching device coupled between the drain of the first PMOS transistor and a drain of the first NMOS transistor, wherein both the first and second PMOS transistors are high voltage transistors and the first switching device is off when the VCCL is below a predetermined voltage level, and the first switching device is on when the VCCL is above the predetermined voltage level.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

This invention describes a voltage level shifter that can minimize power consumption and allow lower internal voltage operations.

Figure 1:
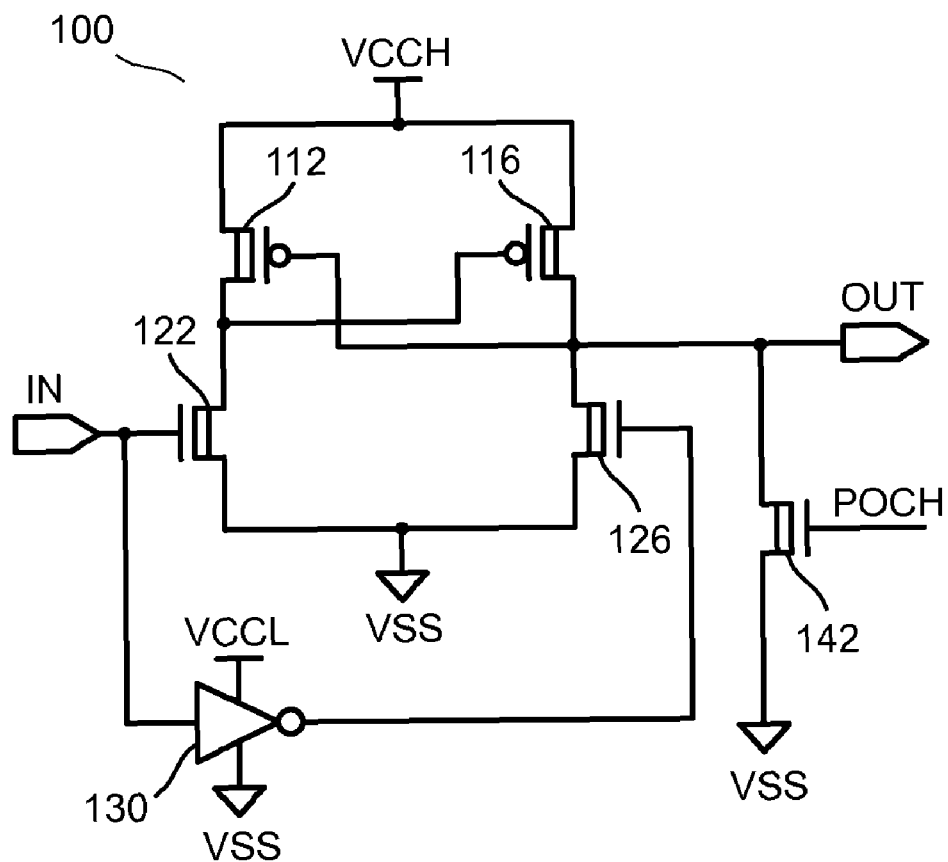
FIG. 1 is a schematic diagram illustrating a conventional low-to-high voltage level shifter.
Figure 2:
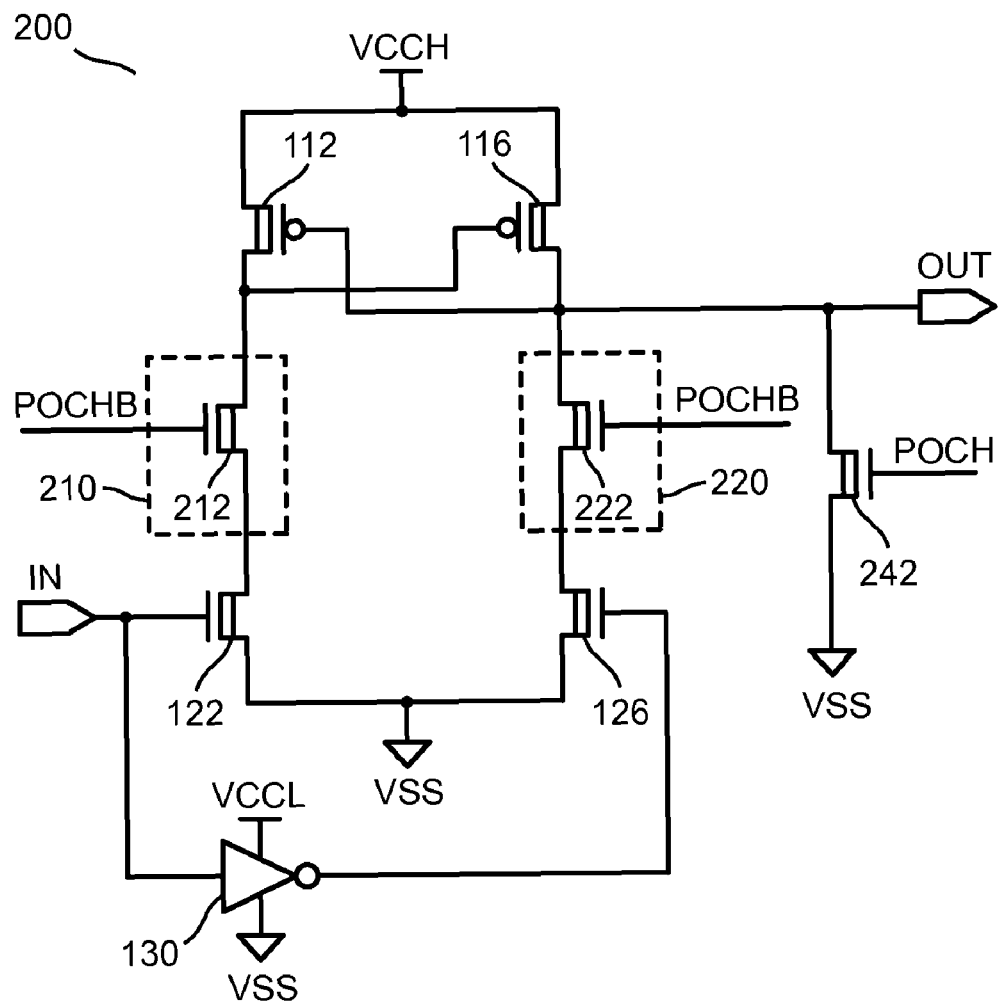
FIG. 2 is a schematic diagram illustrating a low-to-high voltage level shifter according to a first embodiment of the present invention.

FIG. 2 is a schematic diagram illustrating a low-to-high voltage level shifter 200 according to a first embodiment of the present invention. The voltage level shifter 200 is basically also a cross-latch modified from the voltage level shifter 100 of FIG. 1 with unchanged elements sharing the same reference numbers. The modification includes the inserting of two switching devices 210 and 220 and the adding of a NMOS transistor 242. The switching device 210 is inserted between the PMOS transistor 112 and the NMOS transistor 122, i.e., the switching device 210 is connected between the drain of the PMOS transistor 112 and the drain of the NMOS transistor 122. The PMOS transistor 112 is coupled to the NMOS transistor 122 through the switching device 210. Herein the term "coupled" means directly connected or connected through another component, but where that added another component supports the circuit function. Similarly, the switching device 220 is inserted between the PMOS transistor 116 and the NMOS transistor 126, i.e., the switching device 220 is connected between the drain of the PMOS transistor 116 and the drain of the NMOS transistor 126. The PMOS transistor 116 is coupled to the NMOS transistor 126 through the switching device 220.

A function performed by the switching devices 210 and 220 is to block leakage paths between the VCCH and the VSS when the VCCL is lower than normal (internal power saving mode) as described in the background section. The PMOS transistor 112 and the NMOS transistor 122 constitute one leakage path, and the PMOS transistor 116 and the NMOS transistor 126 constitute another. Some of these transistors may not be fully turned off during the internal power saving mode. When the internal circuit is in normal operation, i.e., the VCCL is at its designed voltage range, the switching devices 210 and 220 will be turned on, thus the voltage level shifter 200 will function just the same as the voltage level shifter 100 of FIG. 1.

Referring again to FIG. 2, the switching device 210 and 220 are implemented by high voltage NMOS transistors 212 and 222, respectively. Gates of the NMOS transistors 212 and 222 are connected to a signal POCHB, which is generated from a voltage detection circuit (not shown). With the VCCH being applied to the voltage level shifter 200, when the VCCL is lower than a voltage transition point (VTP), i.e., the internal circuit is in power saving mode, the voltage detection circuit will generate a logic LOW for the signal POCHB, which will turn off the NMOS transistors 212 and 222. As a result, the voltage level shifter 200 has no leakage during the internal power saving mode. The voltage transition point, VTP, is a predetermined voltage level for the internal circuit, and 0<VTP<VCCL_MIN, where VCCL_MIN is a minimum voltage of VCCL. When the internal voltage is lower than the VTP, the internal circuit is in power saving mode, and when the internal voltage is higher than the VTP, the internal circuit is in normal operation.

On the other hand, also with the VCCH being applied to the voltage level shifter 200, when the VCCL is higher than the VTP, i.e., the internal circuit is in normal operation, the voltage detection circuit will generate a logic HIGH for the signal POCHB, which will turn on the NMOS transistor 212 and 222. As a result, the voltage level shifter 200 functions normally when the internal voltage is normal operation mode. Of course, when the VCCH is not applied, there will not be any leakage issue. Then the voltage detection circuit need not generate any definite voltage level for the signal POCHB.

As such, the voltage detection circuit can use the VCCH as a power supply and employ a voltage comparator to compare the VCCL with the predetermined VTP. When the VCCL<VTP, the voltage detection circuit outputs a logic LOW at the signal POCHB. When the VCCL>VTP, the voltage detection circuit outputs a logic HIGH at the signal POCHB. Referring again to the FIG. 2, since the NMOS transistors 212 and 222 are high voltage transistors, the logic HIGH for the signal POCHB is the VCCH. Further details of the voltage detection circuit need not be elaborated here as a skilled in the art would have no difficult to construct such voltage detection circuit.

Referring again to FIG. 2, the high voltage NMOS transistor 242 is connected between the output node OUT and the VSS. A gate of the NMOS transistor 242 is controlled a signal POCH, which is a complimentary to the signal POCHB. Therefore, when the NMOS transistors 212 and 222 are turned off, the NMOS transistor 242 will be turned on, so that the node OUT is pulled to the VSS. When the NMOS transistor 212 and 222 are turned on, the NMOS transistor 242 will be turned off, so that the node OUT is solely driven by the voltage level shifter 200. Apparently, adding the NMOS transistor 242 is to prevent the node OUT from floating when the internal circuit is in power saving mode.

Figure 3:
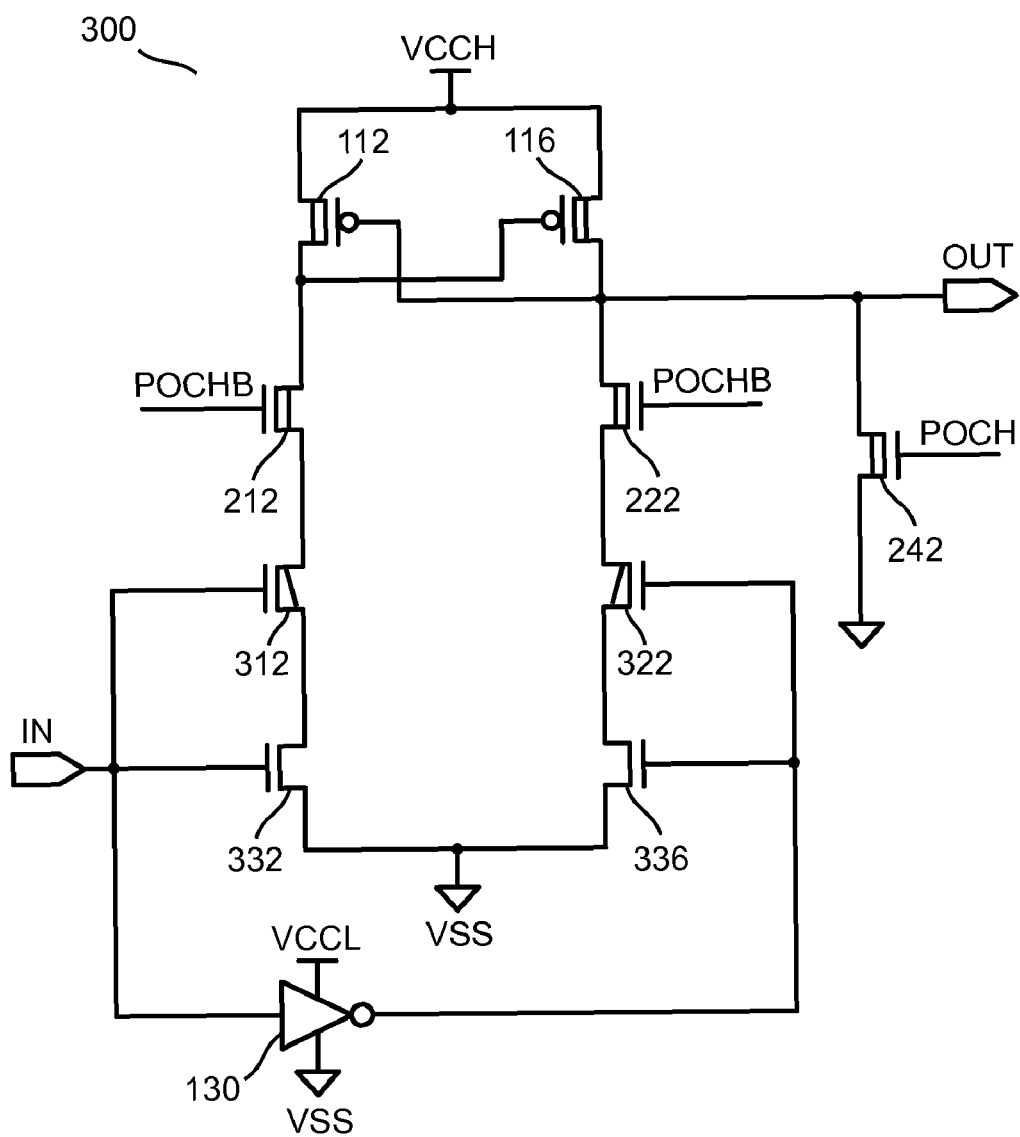
FIG. 3 is a schematic diagram illustrating a low-to-high voltage level shifter according to a second embodiment of the present invention.

FIG. 3 is a schematic diagram illustrating a low-to-high voltage level shifter 300 according to a second embodiment of the present invention. The voltage level shifter 300 differs from the voltage level shifter 200 as shown in FIG. 2 in that a high voltage native NMOS transistor 312 is inserted between the NMOS transistor 212 and a NMOS transistor 332, and another high voltage native NMOS transistor 322 is inserted between the NMOS transistor 222 and a NMOS transistor 336. The native NMOS transistors refers to those transistors receiving no threshold voltage adjustment implants, therefore the threshold voltage of these native NMOS transistors are at approximately zero volt. The NMOS transistors 212 and 222 are switching devices as described above for the voltage level shifter 300. The NMOS transistor 332 and 336 are functionally equivalent to the NMOS transistors 122 and 126 of FIG. 2, respectively. But unlike the NMOS transistors 122 and 126, the NMOS transistors 332 and 336 are low voltage devices, i.e., they have thin gate oxide and small channel length, etc. The low voltage NMOS transistors 332 and 336 allow the VCCL to go lower than that is required by the voltage level shifter 100 or 200. The reason that the low voltage NMOS transistors 332 and 336 can be used here is because of the native NMOS transistors 312 and 322. As the node IN is connected to a gate of the native NMOS transistor 312, and the VCCL level voltage complimentary to that at the node IN is applied at the native NMOS transistor 322. Therefore, the drains of the NMOS transistors 332 and 336 are never exposed to a voltage beyond the VCCL. A skilled in the art may also tie the gates of the native NMOS transistors 312 and 322 to the VCCL instead.

Figure 4:
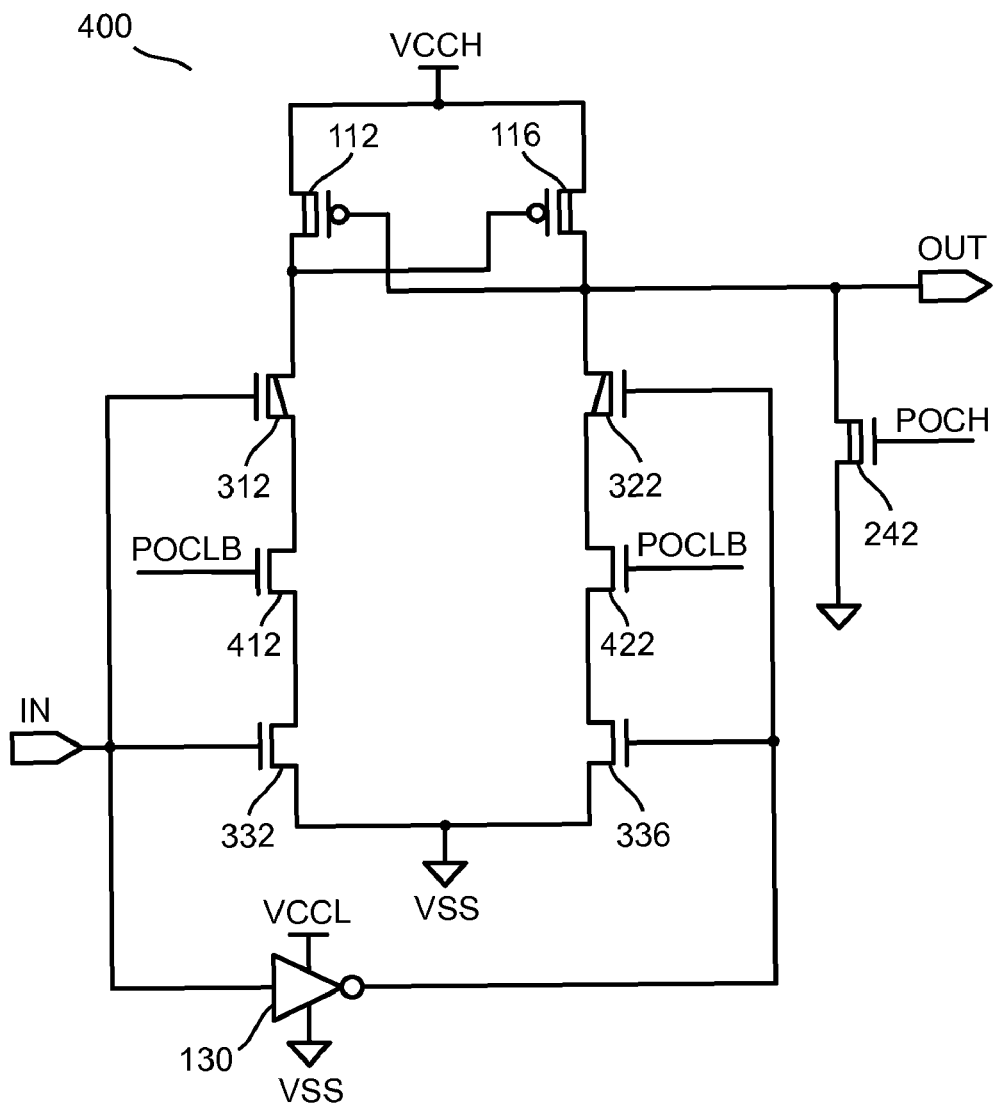
FIG. 4 is a schematic diagram illustrating a low-to-high voltage level shifter according to a third embodiment of the present invention.

FIG. 4 is a schematic diagram illustrating a low-to-high voltage level shifter 400 according to a third embodiment of the present invention. The voltage level shifter 400 differs from the voltage level shifter 300 in that the placement of the switching device and the native NMOS device are swapped. Referring again to FIG. 4, the native NMOS transistor 312 is moved up to be connected directly to the drain of the PMOS transistor 112, and the native NMOS transistor 322 is moved up to be connected directly to the drain of the PMOS transistor 116. With the native NMOS transistors 312 and 322 shielding the high voltage, the switching NMOS transistors 412 and 422 can be made of low voltage transistors. Correspondingly, gate signal POCLB of the switching NMOS transistors 412 and 422 has to be low voltage as well, i.e., the voltage level the signal POCLB is between the VSS and the VCCL. The POCLB of FIG. 4 and the POCHB of FIGS. 2 and 3 have the same logic value but different voltage levels. While the POCLB swings between the VSS and the VCCL, the POCHB swings between the VSS and the VCCH. A skilled in the art would easily modify the aforementioned voltage detection circuit to generate the POCLB instead of the POCHB as described earlier.

Referring back to FIGS. 2, 3 and 4, the switching devices in the voltage level shifters performs the same functions that is to cut off the leakage path between the VCCH and the VSS during the internal voltage ramping up and when the internal circuit is in a power saving mode with the VCCL drops to a lower than normal voltage.

Although the present invention has been described using the low-to-high voltage level shifters 200, 300 and 400, a skilled artisan would appreciate that the cross-latch circuit can be used to construct a high-to-low voltage level shifter, particularly the switching mechanism for cutting off leakage path remains the same for both the low-to-high and high-to-low voltage conversers.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A voltage level shifting circuit for an integrated circuit system having an internal low voltage power supply (VCCL) and an external high voltage power supply (VCCH), the voltage level shifting circuit comprising:
    a first and a second PMOS transistor each with a source connected to the VCCH, a gate of the first PMOS transistor being connected to a drain of the second PMOS transistor, and a gate of the second PMOS transistor being connected to a drain of the first PMOS transistor;
    a first NMOS transistor with a source connected to a ground (VSS) and a gate connected to a first signal swinging between the VCCL and the VSS;
    a first switching device coupled between the drain of the first PMOS transistor and a drain of the first NMOS transistor; and
    a first native NMOS transistor with a drain connected to the first switching device and a source connected to a drain of the first NMOS transistor,
    wherein both the first and second PMOS transistors are high voltage transistors and the first switching device is off when the VCCL is below a predetermined voltage level, and the first switching device is on when the VCCL is above the predetermined voltage level.

2. The voltage level shifting circuit of claim 1, wherein the first NMOS transistor is a high voltage transistor.

3. The voltage level shifting circuit of claim 1, wherein the first switching device is a high voltage NMOS transistor with a source connected to the drain of the first PMOS transistor and a drain connected to the drain of the first NMOS transistor.

4. The voltage level shifting circuit of claim 1 further comprising:
    a second NMOS transistor with a source connected to the VSS and a gate connect to a second signal complimentary to the first signal, the second signal swinging between the VCCL and the VSS; and
    a second switching device connected between the drain of the second PMOS transistor and a drain of the second NMOS transistor,
    wherein the second switching device is off when the VCCL is below a predetermined voltage level, and the first switching device is on when the VCCL is above the predetermined voltage level.

5. The voltage level shifting circuit of claim 4, wherein the second NMOS transistor is a high voltage transistor.

6. The voltage level shifting circuit of claim 1, wherein the first NMOS transistor is a low voltage transistor.

7. The voltage level shifting circuit of claim 1 further comprising:
    a second NMOS transistor with a source connected to the VSS and a gate connect to a second signal complimentary to the first signal, the second signal swinging between the VCCL and the VSS;
    a second native NMOS transistor with a source connected to a drain of the second NMOS transistor; and
    a second switching device connected between the drain of the second PMOS transistor and a drain of the second native NMOS transistor,
    wherein the second NMOS transistor is a low voltage transistor and the second switching device is off when the VCCL is below a predetermined voltage level, and the first switching device is on when the VCCL is above the predetermined voltage level.

8. The voltage level shifting circuit of claim 1 further comprising a second native NMOS transistor with a drain connected to the drain of the first PMOS transistor and a source connected to the first switching device.

9. The voltage level shifting circuit of claim 8, wherein the first NMOS transistor is a low voltage transistor.

10. A voltage level shifting circuit for an integrated circuit system having an internal low voltage power supply (VCCL) and an external high voltage power supply (VCCH), the voltage level shifting circuit comprising:

a first and a second PMOS transistor each with a source connected to the VCCH, a gate of the first PMOS transistor being connected to a drain of the second PMOS transistor, and a gate of the second PMOS transistor being connected to a drain of the first PMOS transistor;

a first and a second NMOS transistor, the first NMOS transistor having a source connected to a ground (VSS) and a gate connected to a first signal, the second NMOS transistor having a source connected to the VSS and a gate connected to a second signal complimentary to the first signal, both the first and second signal swinging between the VCCL and the VSS;

a first switching device coupled between the drain of the first PMOS transistor and a drain of the first NMOS transistor;

a second switching device coupled between the drain of second PMOS transistor and a drain of the second NMOS transistor;

a first native NMOS transistor with a drain connected to the first switching device and a source connected to a drain of the first NMOS transistor; and a second native NMOS transistor with a drain connected to the second switching device and a source connected to a drain of the second NMOS transistor, wherein both the first and second PMOS transistors are high voltage transistors and the first and the second switching device are off when the VCCL is below a predetermined voltage level, and the first and the second switching device are on when the VCCL is above the predetermined voltage level.

11. The voltage level shifting circuit of claim 10, wherein the first and second NMOS transistor are high voltage transistors.

12. The voltage level shifting circuit of claim 10, wherein the first and second switching device are high voltage NMOS transistors, the first switching device having a source connected to the drain of the first PMOS transistor and a drain connected to the drain of the first NMOS transistor, and the second switching device have a source connected to the drain of the second PMOS transistor and a drain connected to the drain of the second NMOS transistor.

13. The voltage level shifting circuit of claim 10, wherein the first and second NMOS transistor are low voltage transistors.

14. The voltage level shifting circuit of claim 10 further comprising:

a third native NMOS transistor with a drain connected to the drain of the first PMOS transistor and a source connected to the first switching device; and a second native NMOS transistor with a drain connected to the drain of the second PMOS transistor and a source connected to the second switching device.

15. The voltage level shifting circuit of claim 14, wherein the first and second NMOS transistor are low voltage transistors.

16. A voltage level shifting circuit for an integrated circuit system having an internal low voltage power supply (VCCL) and an external high voltage power supply (VCCH), the voltage level shifting circuit comprising:

a first and a second PMOS transistor each with a source connected to the VCCH, a gate of the first PMOS transistor being connected to a drain of the second PMOS transistor, and a gate of the second PMOS transistor being connected to a drain of the first PMOS transistor;

a first NMOS transistor with a source connected to a ground (VSS) and a gate connected to a first signal swinging between the VCCL and the VSS, the first NMOS transistor being a high voltage transistor;

a first switching device coupled between the drain of the first PMOS transistor and a drain of the first NMOS transistor; and a first native NMOS transistor with a drain connected to the first switching device and a source connected to a drain of the first NMOS transistor, wherein both the first and second PMOS transistors are high voltage transistors and the first switching device is off when the VCCL is below a predetermined voltage level, and the first switching device is on when the VCCL is above the predetermined voltage level.

17. The voltage level shifting circuit of claim 16, wherein the first switching device is a high voltage NMOS transistor with a source connected to the drain of the first PMOS transistor and a drain connected to the drain of the first NMOS transistor.

18. The voltage level shifting circuit of claim 16 further comprising:

a second NMOS transistor with a source connected to the VSS and a gate connect to a second signal complimentary to the first signal, the second signal swinging between the VCCL and the VSS, the second NMOS transistor being a high voltage transistor; and a second switching device connected between the drain of the second PMOS transistor and a drain of the second NMOS transistor, wherein the second switching device is off when the VCCL is below a predetermined voltage level, and the first switching device is on when the VCCL is above the predetermined voltage level.

* * * * *